United States Patent
Huang et al.

(10) Patent No.: US 11,538,897 B2
(45) Date of Patent: Dec. 27, 2022

(54) DISPLAY DEVICE

(71) Applicant: InnoLux Corporation, Miao-Li County (TW)

(72) Inventors: Hui-Min Huang, Miao-Li County (TW); Li-Wei Sung, Miao-Li County (TW); Cheng-Tso Chen, Miao-Li County (TW); Chia-Min Yeh, Miao-Li County (TW)

(73) Assignee: INNOLUX CORPORATION, Miao-Li County (TW)

( * ) Notice: Subject to any disclaimer, the term of this patent is extended or adjusted under 35 U.S.C. 154(b) by 0 days.

(21) Appl. No.: 17/380,735

(22) Filed: Jul. 20, 2021

(65) Prior Publication Data
US 2021/0351265 A1    Nov. 11, 2021

Related U.S. Application Data

(62) Division of application No. 16/259,352, filed on Jan. 28, 2019, now Pat. No. 11,121,201.

(30) Foreign Application Priority Data

Feb. 22, 2018  (CN) ......................... 201810158603.2

(51) Int. Cl.
*H01L 27/32* (2006.01)
*H05K 1/11* (2006.01)
(Continued)

(52) U.S. Cl.
CPC ........ *H01L 27/3276* (2013.01); *H01L 27/124* (2013.01); *H01L 27/3279* (2013.01);
(Continued)

(58) Field of Classification Search
CPC .......... H05K 1/025; H05K 1/115; H05K 3/06; H05K 2201/09227; H05K 2201/10128;
(Continued)

(56) References Cited

U.S. PATENT DOCUMENTS 9,685,131 B2 *   6/2017  Tanaka ................. G09G 3/3666
10,424,603 B2 *  9/2019  Lee ..................... H01L 27/1218
(Continued)

FOREIGN PATENT DOCUMENTS

| CN | 105788462 A | 7/2016 |
| CN | 107342036 A | 11/2017 |
| CN | 107634072 A | 1/2018 |

*Primary Examiner* — Jason M Mandeville
(74) *Attorney, Agent, or Firm* — Muncy, Geissler, Olds & Lowe, P.C.

(57) ABSTRACT

A display device includes: a substrate having a display area and non-display area; a first conductive layer disposed corresponding to the display area and comprising a first line segment, a second line segment and a third line segment parallel to the first line segment, wherein the first and second line segments are disposed at two sides of the non-display area; a third conductive layer disposed on the substrate and including a first connection line electrically connected to the first and second line segments, and a projection of the first connection line is overlapped with at least a portion of the third line segment; and a first insulating layer disposed between the first and third conductive layers and including a first through-hole and a second through-hole, and the third conductive layer is electrically connected to the first and second line segments via the first and the second through-holes, respectively.

8 Claims, 6 Drawing Sheets

(51) Int. Cl.
*H05K 1/02* (2006.01)
*H05K 3/06* (2006.01)
*H01L 27/12* (2006.01)

(52) U.S. Cl.
CPC .............. *H05K 1/025* (2013.01); *H05K 1/115* (2013.01); *H05K 3/06* (2013.01); *G09G 2300/0426* (2013.01); *H05K 2201/09227* (2013.01); *H05K 2201/10128* (2013.01)

(58) Field of Classification Search
CPC ............... H01L 27/124; H01L 27/3276; H01L 27/3279; G09G 2300/0426; G09F 9/33
USPC ................................................ 345/204, 55
See application file for complete search history.

(56) References Cited

U.S. PATENT DOCUMENTS

| | | | |
|---|---|---|---|
| 11,121,201 B2* | 9/2021 | Huang | ................. H01L 27/124 |
| 2010/0053058 A1 | 3/2010 | Nagashima et al. | |
| 2010/0060842 A1 | 3/2010 | Igeta et al. | |
| 2014/0197428 A1 | 7/2014 | Wang et al. | |
| 2016/0019856 A1* | 1/2016 | Tanaka | ................. G09G 3/3677 |
| | | | 345/206 |
| 2017/0154566 A1 | 6/2017 | Ryoo et al. | |
| 2017/0288003 A1 | 10/2017 | Kim et al. | |
| 2017/0294502 A1 | 10/2017 | Ka et al. | |
| 2018/0129111 A1 | 5/2018 | Wu et al. | |
| 2019/0081118 A1 | 3/2019 | Oh et al. | |
| 2019/0214600 A1 | 7/2019 | Park et al. | |
| 2019/0252411 A1* | 8/2019 | Lee | ....................... H01L 27/124 |
| 2019/0261512 A1 | 8/2019 | Huang et al. | |
| 2020/0168633 A1 | 5/2020 | Ina et al. | |

\* cited by examiner

DISPLAY DEVICE

CROSS REFERENCE TO RELATED APPLICATION

This application claims the benefits of the Chinese Patent Application Serial Number 201.8101586012, filed on Feb. 22, 2018, the subject matter of which is incorporated herein by reference.

This application is a division of U.S. Patent application for "Display device", U.S. application Ser. No. 16/259,352 filed Jan. 28, 2019, and the subject matter of which is incorporated herein by reference.

BACKGROUND

1. Field

The present disclosure relates to display devices and, more particularly, to a display device which, in the case of the presence of a non-display area on a display panel or the presence of an opening on a substrate, has thin bezels.

2. Description of Related Art

Owing to technological advancement, electronic products are increasingly lightweight, thin or compact in order to meet consumer needs. Hence, display devices nowadays are no longer restricted to cathode ray tubes (CRT) but develop into thin display units. The thin display units can be applied to cellular phones, cameras, camcorders, laptops, mobile navigation devices, vehicle dashboards, electronic watches, and TV sets. Related manufacturers not only endeavor to develop thinner display devices but also attach great importance to thin bezel design.

However, wirings and components will surround a non-display area or an opening in the event of the presence of the non-display area on a display panel or the presence of the opening on a substrate. Furthermore, owning to process-related limitation, the non-display area is unfit for thin bezel design and thus fails to meet consumer needs.

Therefore, it is imperative to provide a display device that overcomes wiring-related limitation and thus has thin bezels even when a display panel comprises a non-display area or even when a substrate comprises an opening.

SUMMARY

The present disclosure provides a display device comprising: a substrate comprising a display area and a non-display area, wherein the display area surrounds the non-display area; a first conductive layer disposed on the substrate and corresponding to the display area, wherein the first conductive layer comprises a first line segment, a second line segment and a third line segment, the first line segment and the second line segment are disposed at two sides of the non-display area, and the third line segment is disposed parallel to the first line segment; a third conductive layer disposed on the substrate and comprising a first connection line electrically connected to the first line segment and the second line segment, and a projection of the first connection line is overlapped with at least a portion of the third line segment from top view; and a first insulating layer disposed between the first conductive layer and the third conductive layer, wherein the first insulating layer further comprises a first through-hole and a second through-hole, the third conductive layer is electrically connected to the first line segment via the first through-hole, and the third conductive layer is electrically connected to the second line segment via the second through-hole.

DETAILED DESCRIPTION

The implementation of the present disclosure is hereunder illustrated by specific embodiments. Persons skilled in the art can easily understand the other advantages and effects of the present disclosure by referring to the disclosure contained herein. The present disclose can also be implemented or applied by the other different specific embodiments. Depending on different viewpoints and applications, various modifications and changes can be made to the details disclosed herein without departing from the spirit of the present disclosure.

Ordinal numbers, such as 'first', 'second' and 'third', used hereunder describe claimed components but do not state implicitly or explicitly what order the claimed components are previously in, whether a claimed component precedes or follows another claimed component, or what order the steps of a manufacturing method are in. The sole purpose of the ordinal numbers is to distinguish a claimed component from another claimed component when the two claimed components are named exactly the same as each other.

Direction-related prepositions and adjectives used herein, such as "on", "upper", "above", "under", "lower" and "below", describe aforesaid two components either in direct contact with each other or not in direct contact with each other.

Features described hereunder in any one of the embodiments of the present disclosure can be combined to form another embodiment.

Embodiment 1

Figure 1A:
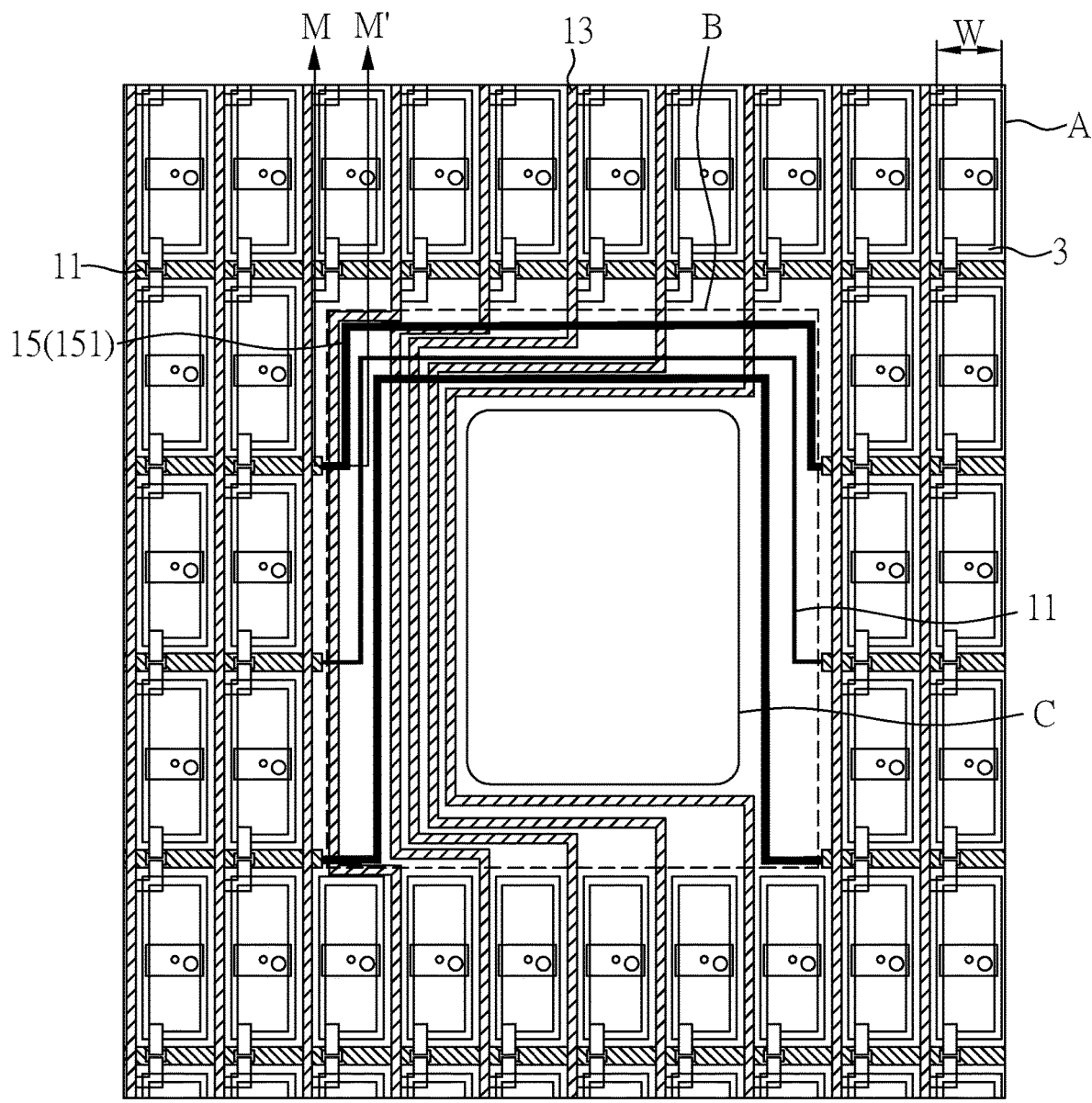
FIG. 1A is a top view of a portion of a display device according to an embodiment of the present disclosure.
Figure 1B:
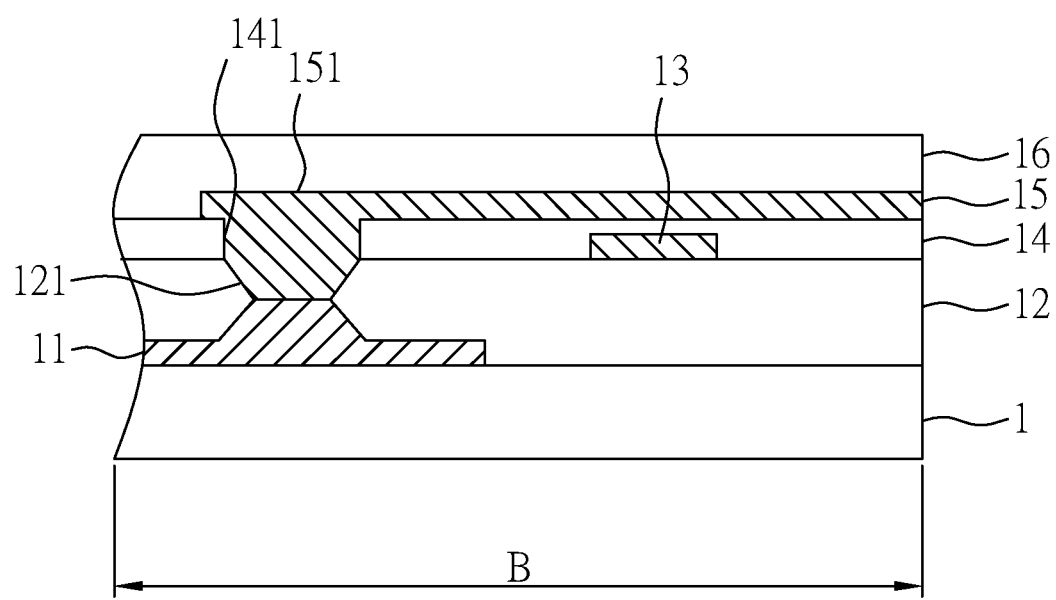
FIG. 1B is a cross-sectional view of the display device taken along line M-M' of FIG. 1A.

FIG. 1A is a top view of a portion of a display device according to an embodiment of the present disclosure. FIG. 1B is a cross-sectional view of the display device taken along line M-M' of FIG. 1A. First, this embodiment of the present disclosure provides a substrate 1. The substrate 1 comprises a display area A and a non-display area B. A photolithography or etching process is performed on the substrate 1 to form a first metal layer (functioning as a first conductive layer 11) and then on the first conductive layer 11 to form a first insulating layer 12. The aforesaid steps are repeated to form a second metal layer (functioning as a second conductive layer 13) and a second insulating layer 14 consecutively. Afterward, a third metal layer (functioning as a third conductive layer 15) is formed on the second insulating layer 14, and then a third insulating layer 16 is formed thereon. The third conductive layer 15 comprises a first connection line 151. The first insulating layer 12 comprises a first hole 121. The second insulating layer comprises a second hole 141. The first conductive layer 11 and the first connection line 151 extend into the first hole 121 and the second hole 141. The first conductive layer 11 and the first connection line 151 contact and electrically connected with each other.

The substrate 1 is a glass substrate, but the present disclosure is not limited thereto. The first conductive layer 11, the second conductive layer 13, and the third conductive layer 15 may comprise metal, such as gold, silver, copper, aluminum, molybdenum, titanium, chromium or an alloy thereof, but the present disclosure is not limited thereto. The first connection line 151 may comprises metal or metallic oxide, such as Indium Tin Oxide (ITO) or Indium Zinc Oxide (IZO), or any other conductive material, as needed, but the present disclosure is not limited thereto. The first conductive layer 11, the second conductive layer 13, and the third conductive layer 15 may be made of the same material or different materials, provided that the result of a sheet impedance of the first connection line 151 of the third conductive layer 15 divided by a sheet impedance of the first conductive layer 11 electrically connected to the first connection line 151 is greater than 0 and less than or equal to 10. The first conductive layer 11, the second conductive layer 13, and the third conductive layer 15 are each independently a monolayer or multilayer structure as needed. The first insulating layer 12, the second insulating layer 14 and the third insulating layer 16 may comprise silicon oxide, silicon nitride or a combination thereof; but the present disclosure is not limited thereto.

A display device in an embodiment of the present disclosure comprises: a substrate 1 comprising a display area A and a non-display area B; a first conductive layer 11 disposed on the substrate 1 and corresponding to the display area A; a second conductive layer 13 disposed on the substrate 1 and corresponding to the display area A, wherein, the second conductive layer 13 and the first conductive layer 11 cross from top view; a first insulating layer 12 disposed between the first conductive layer 11 and the second conductive layer 13; a third conductive layer 15 disposed on the substrate 1 and corresponding to the non-display area B, the third conductive layer 15 comprising a first connection line 151; and a second insulating layer 14 disposed between the second conductive layer 13 and the third conductive layer 15, wherein, the first conductive layer 11 is electrically connected to the first connection line 151 of the third conductive layer 15, and the result of a sheet impedance of the first connection line 151 of the third conductive layer 15 divided by a sheet impedance of the first conductive layer 11 electrically connected to the first connection line 151 is greater than 0 and less than or equal to 10. In this embodiment, the non-display area B is surrounded by the display area A. However, in another embodiment, the non-display area B is near the display area A, or the display area A is near just a portion of the non-display area B, as needed. The shape of the non-display area B is not limited by this embodiment and thus may be rectangular, round, polygonal or irregular. The routing of the first conductive layer 11, second conductive layer 13 or third conductive layer 15 may conform to the shape of the non-display area B.

The first conductive layer 11 functions as a scan line, and the second conductive layer 13 functions as a data line, but the present disclosure is not limited thereto. The first conductive layer 11 may also function as a data line, or the second conductive layer 13 may also function as a scan line. When the non-display area B comprises a non-circuit area C which are not overlapped with the first conductive layer 11, the second conductive layer 13 or the third conductive layer 15 but is spaced apart from the display area A by an overly short distance, a short circuit may easily develop between adjacent scan lines or adjacent data lines, because the scan lines or data lines must circumvent the non-circuit area C in order to transmit a signal. On the other hand, the display device cannot have thin bezels, when the distance between the non-circuit area C and the display area A is overly long. According to the present disclosure, the third conductive layer 15 is disposed in the non-display area B, whereas the third conductive layer 15 comprising a first connection line 151 electrically connected to the first conductive layer 11 via the first hole 121 and the second hole 141; hence, the same signal can be transmitted for a limited distance without causing a short circuit, thereby allowing the display device to have thin bezels. In this embodiment, the third conductive layer 15 is electrically connected to the first conductive layer 11, so as to transmit signals of the scan lines, but the present disclosure is not limited thereto. In this embodiment, the non-circuit area C can be disposed centrally in the non-display area B and surrounded by the display area A. However, in another embodiment, the non-circuit area C can be near the display area A, or the non-circuit area C is near just a portion of the non-display area B, as needed. The shape of the non-circuit area C is not limited by this embodiment and thus may be rectangular, round, polygonal or irregular. The routing of the first conductive layer 11, second conductive layer 13 or third conductive layer 15 may conform to the shape of the non-circuit area C.

Figure 1C:
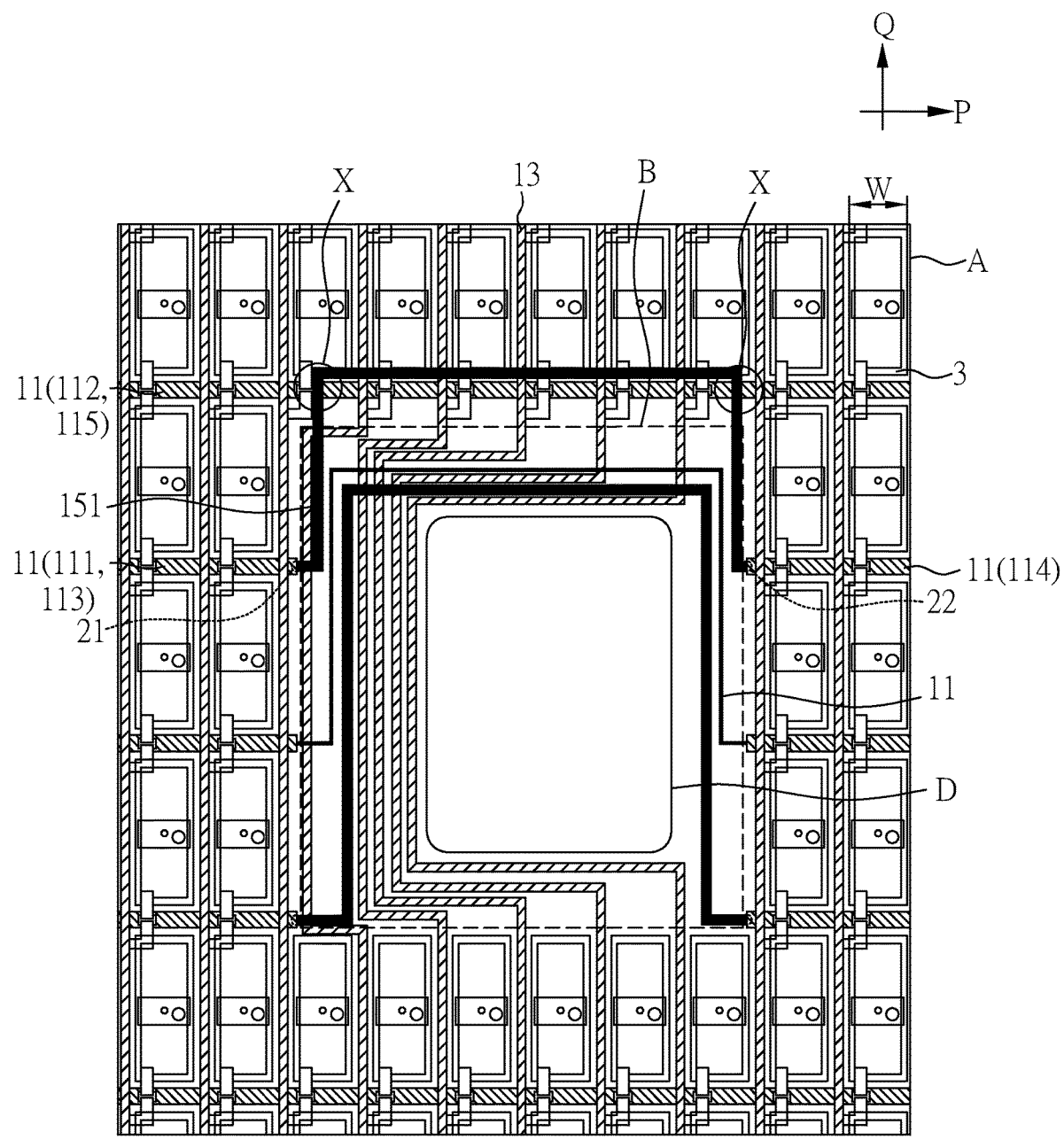
FIG. 1C is a top view of a portion of the display device according to an embodiment of the present disclosure.

FIG. 1C is a top view of a portion of the display device according to another embodiment of the present disclosure. The first conductive layer 11 comprises a second wiring 111 and a third wiring 112 electrically insulated with the second wiring 111. The second wiring 111 is adjacent and parallel to the third wiring 112. The second wiring 111 and the third wiring 112 extend in a first direction P. The first connection line 151 of the third conductive layer 15 is electrically connected to the second wiring 111. The projection of the first connection line 151 on the substrate 1 is overlapped with at least a portion of the third wiring 112.

In another embodiment of the present disclosure, the substrate 1 comprises an opening D disposed corresponding to the non-display area B. The opening D is not overlapped with the first conductive layer 11, the second conductive layer 13, or the third conductive layer 15. The opening D may penetrate the substrate 1.

This embodiment of the present disclosure is not restrictive of the position of the non-display area B. For instance, the non-display area B can be disposed at the center of the substrate 1, an edge of the substrate 1, or a corner of the substrate 1, but the present disclosure is not limited thereto. In an embodiment of the present disclosure, the display area A of the display device comprises a plurality of pixel units 3, and the non-display area B is disposed between at least two pixel units 3. Preferably, each pixel unit 3 is of a width W, and the width of the non-display area B is greater than 2 W.

In another embodiment of the present disclosure, as shown in FIG. 1C, the display area A surrounds the non-display area B, and the first conductive layer 11 comprises a first scan line segment 113, a second scan line segment 114 and a third scan line segment 115 which extend in the first direction P. The first scan line segment 113 and the second scan line segment 114 are disposed corresponding to two sides of the non-display area B. The third scan line segment 115 is disposed parallel to the first scan line segment 113. The first connection line 151 of the third conductive layer 15 is electrically connected to the first scan line segment 113 and the second scan line segment 114. The projection of the first connection line 151 is overlapped with at least a portion of the third scan line segment 115 from top view. The first insulating layer 12 comprises a first through-hole 21 (indicated by a dashed line) and a second through-hole 22 (indicated by a dashed line). The first connection line 151 of the third conductive layer 15 electrically connects to the first scan line segment 113 via the first through-hole 21. The first connection line 151 of the third conductive layer 15 electrically connects to the second scan line segment 114 via the second through-hole 22. In this embodiment, the first connection line 151 and the third scan line segment 115 overlap at two points, namely a junction X, and the first connection line 151 and the third scan line segment 115 are electrically insulated at the junction X. In this embodiment, the third conductive layer 15 and the first conductive layer 11 are not necessarily made of metal. Instead, the first conductive layer 11 may comprise metal, whereas the third conductive layer 15 may comprise metallic oxide, such as ITO or IZO, or any other conductive material or metal, as needed, but the present disclosure is not limited thereto. The display device in this embodiment of the present disclosure will work well and can have thin bezels, provided that limitation on the distances between the wirings in the conductive layers is reduced.

Embodiment 2

Figure 2A:
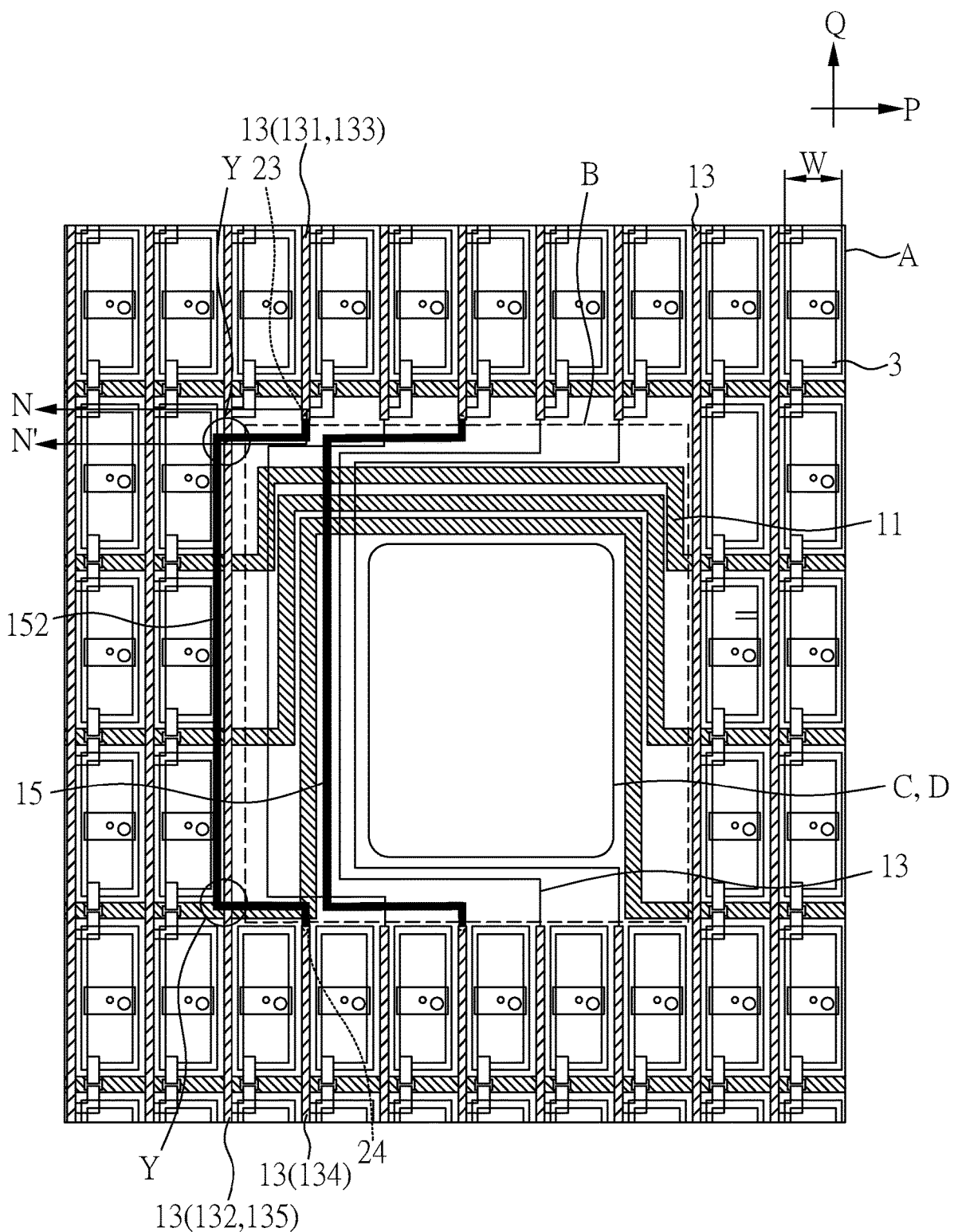
FIG. 2A is a top view of a portion of the display device according to an embodiment of the present disclosure.
Figure 2B:
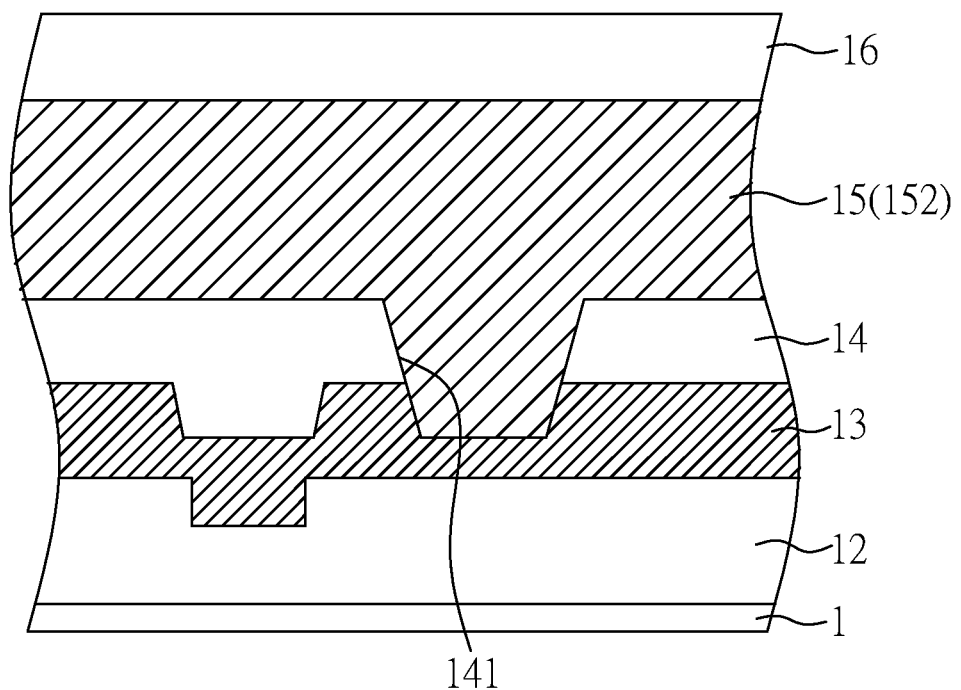
FIG. 2B is a cross-sectional view of the display device taken along line N-N' of FIG. 2A.

FIG. 2A is a top view of a portion of the display device according to another embodiment of the present disclosure. This embodiment is distinguished from embodiment 1 by the technical feature as follows: in this embodiment, the third conductive layer 15 and the second conductive layer 13 are electrically connected, so as to transmit signals of data lines, allowing the display device to have thin bezels. Referring to FIG. 2A, this embodiment has technical features as follows: the third conductive layer 15 comprises a second connection line 152; the second conductive layer 13 is electrically connected to the second connection line 152 of the third conductive layer 15; the result of a sheet impedance of the second connection line 152 of the third conductive layer 15 divided by a sheet impedance of the second conductive layer 13 electrically connected to the second connection line 152 is greater than 0 and less than or equal to 10. FIG. 2B is a cross-sectional view of the display device taken along line N-N' of FIG. 2A. As shown in the diagram, the second connection line 152 of the third conductive layer 15 extends into the second hole 141 of the second insulating layer 14 and thus electrically connects to the second conductive layer 13.

In another embodiment of the present disclosure, the second conductive layer 13 comprises a fourth wiring 131 and a fifth wiring 132 electrically insulated with the fourth wiring 131. The fourth wiring 131 is adjacent and parallel to the fifth wiring 132. The second connection line 152 of the third conductive layer 15 is electrically connected to the fourth wiring 131. The projection of the second connection line 152 on the substrate 1 is overlapped with at least a portion of the fifth wiring 132.

The materials which the substrate 1, the first conductive layer 11, the second conductive layer 13, the third conductive layer 15, the first insulating layer 12, the second insulating layer 14, and the third insulating layer 16 are made of and the positions of the display area A and non-display area B in this embodiment are the same as their counterparts in Embodiment 1 and thus are, for the sake of brevity, not described herein again. In this embodiment, the first conductive layer 11 functions as a scan line, and the second conductive layer 13 functions as a data line, but the present disclosure is not limited thereto. The first conductive layer 11 can also function as a data line, or the second conductive layer 13 can also function as a scan line.

In another embodiment of the present disclosure, as shown in FIG. 2A, the display area A surrounds the non-display area B, and the second conductive layer 13 comprises a first data line segment 133, a second data line segment 134 and a third data line segment 135 which extend in a second direction Q. The first data line segment 1133 and the second data line segment 134 are disposed corresponding to two sides of the non-display area B. The third data line segment 135 is parallel to the first data line segment 133. The second connection line 152 of the third conductive layer 15 is electrically connected to the first data line segment 133 and the second data line segment 134. The projection of the second connection line 152 is overlapped with at least a portion of the third data line segment 135 from top view. The second insulating layer 14 comprises a third through-hole 23 (indicated by a dashed line) and a fourth through-hole 24 (indicated by a dashed line). The second connection line 152 of the third conductive layer 15 electrically connects to the first data line segment 133 via the third through-hole 23. The second connection line 152 of the third conductive layer 15 electrically connects to the second data line segment 134 via the fourth through-hole 24. In this embodiment, the second connection line 152 and the third data line segment 135 overlap at two points, namely a junction Y, and the second connection line 152 and the third data line segment 135 are electrically insulated at the junction Y. In this embodiment, the third conductive layer 15 and the second conductive layer 13 are not necessarily made of metal. Instead, the second conductive layer may comprise metal, whereas the third conductive layer 15 may comprise metallic oxide, such as ITO or IZO, or any other conductive material or metal, as needed, but the present disclosure is not limited thereto. The display device in this embodiment of the present disclosure will work well and can have thin bezels, provided that limitation on the distances between the wirings in the conductive layers is reduced, or the distance between the opening D and the display area A is reduced.

Embodiment 3

Figure 3:
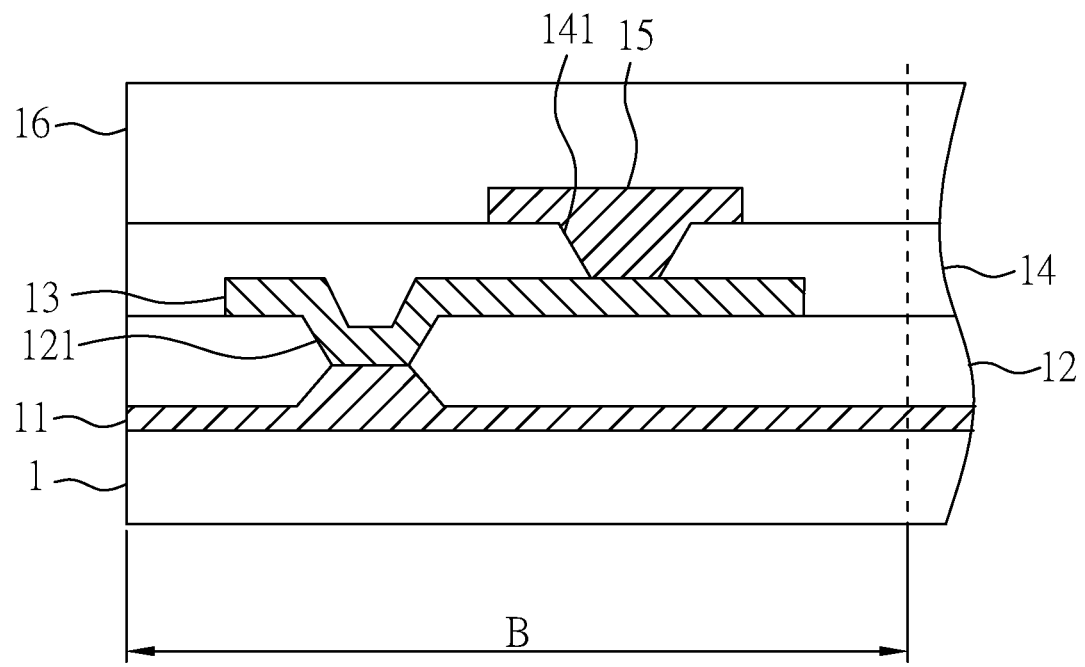
FIG. 3 is a cross-sectional view of a portion of the display device according to an embodiment of the present disclosure.

FIG. 3 is a cross-sectional view of a portion of the display device according to an embodiment of the present disclosure. This embodiment is distinguished from embodiment 1 by technical features as follows: the first conductive layer 11 and the third conductive layer 15 are electrically connected by the first conductive layer 11 is electrically connected to a portion of the second conductive layer 13, and the third conductive layer 15 is electrically connected to the portion of the second conductive layer 13 via the second hole 141, and the second conductive layer 13 is electrically connect to the first conductive layer 11 via the first hole 121, thus the first conductive layer 11 is electrically connected to the third conductive layer 15, so as to transmit the same signal, hence, the same signal can be transmitted for a limited distance without causing a short circuit, thereby allowing the display device to have thin bezels.

Embodiment 4

Figure 4:
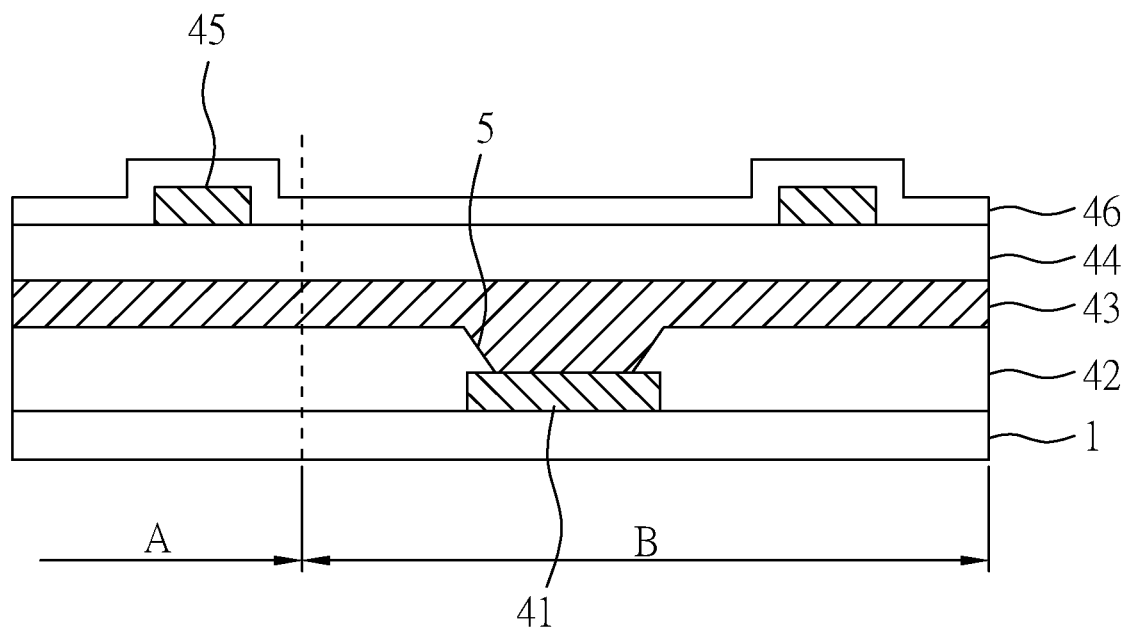
FIG. 4 is a cross-sectional view of a portion of the display device according to an embodiment of the present disclosure.

FIG. 4 is a cross-sectional view of a portion of the display device according to another embodiment of the present disclosure. Referring to FIG. 1A and FIG. 4, first, this embodiment of the present disclosure provides a substrate 1. The substrate 1 comprises a display area A and a non-display area B. A photolithography or etching process is performed to form a third metal layer (functioning as the third conductive layer 41) in the non-display area B of the substrate 1 and then form a second insulating layer 42 on the third conductive layer 41. The aforesaid steps are repeated to form a first metal layer (functioning as a first conductive layer 43), a first insulating layer 44, a second metal layer (functioning as a second conductive layer 45), and a third insulating layer 46 consecutively. The first conductive layer 43 is disposed between the first insulating layer 44 and the second insulating layer 42. The first conductive layer 43 and the third conductive layer 41 are electrically connected through a third hole 5. In some embodiments (figure not shown), the third conductive layer 41, the first conductive layer 43 and the second conductive layer 45 are electrically connect to each other. This embodiment is distinguished from Embodiment 1 by the technical feature: this embodiment involves forming a third metal layer first and then forming the other layers consecutively.

In this embodiment, the first conductive layer 43 functions as a scan line, and the second conductive layer 45 functions as a data line, but the present disclosure is not limited thereto. The first conductive layer 43 may also function as a data line, or the second conductive layer 45 may also function as a scan line. In this embodiment, the purpose of the third conductive layer 41 is to reduce limitation on the distances between the wirings in the conductive layers, reduce the distance between the opening D and the display area A, or enable the display device to have thin bezels.

In conclusion, the display device of the present disclosure has thin bezels, by forming a third metal layer in a non-display area, allowing the third metal layer to electrically connect to a first metal layer or a second metal layer, so as to transmit the same signal. The aforesaid embodiments can be combined, but the present disclosure is not restrictive of combinations of the aforesaid embodiments.

The display device of the present disclosure is applied to various types of display devices comprising an organic light-emitting diode (OLED), a quantum dot (OD), a fluorescence molecule, a phosphor, a light-emitting diode (LED), a micro light-emitting diode (micro LED) or any other display medium. In addition, the display device of the present disclosure is applied to any touch display device equipped with a touch panel. Furthermore, the display device of the present disclosure is applied to any tiled display device, any non-curved, curved or flexible display device or any touch display device.

The aforesaid specific embodiments of the present disclosure must be interpreted to be solely illustrative rather than restrictive, in any way, of the present disclosure.

What is claimed is:

1. A display device, comprising:
a substrate comprising a display area and a non-display area, wherein the display area surrounds the non-display area;
a first conductive layer disposed on the substrate and corresponding to the display area, wherein the first conductive layer comprises a first line segment, a second line segment, and a third line segment, the first line segment and the second line segment are disposed at two sides of the non-display area, and the third line segment is disposed parallel to the first line segment;
a third conductive layer disposed on the substrate and comprising a first connection line electrically connected to the first line segment and the second line segment, wherein the first connection line comprises a fourth line segment, a fifth line segment and a sixth line segment, the fourth line segment and the fifth line segment are disposed at two sides of the non-display area, the sixth line segment is disposed corresponding to the display area, a portion of the sixth line segment is parallel to the third line segment, a portion of the fourth line segment or a portion of the fifth line segment is parallel to the third line segment, and a projection of the first connection line is overlapped with at least a portion of the third line segment from top view; and
a first insulating layer disposed between the first conductive layer and the third conductive layer, wherein the first insulating layer further comprises a first through-hole and a second through-hole, the third conductive layer is electrically connected to the first line segment via the first through-hole, and the third conductive layer is electrically connected to the second line segment via the second through-hole.

2. The display device of claim 1, wherein a result of a sheet impedance of the first connection line divided by a sheet impedance of the first conductive layer is greater than 0 and less than or equal to 10.

3. The display device of claim 1, further comprising a second conductive layer disposed on the substrate and corresponding to the display area, wherein, the second conductive layer and the first conductive layer cross from top view.

4. The display device of claim 3, further comprising a second insulating layer disposed between the second conductive layer and the third conductive layer.

5. The display device of claim 3, further comprising a second insulating layer disposed between the second conductive layer and the first conductive layer, wherein the first conductive layer is disposed between the first insulating layer and the second insulating layer.

6. The display device of claim 1, wherein the display area comprises a plurality of pixel units, and the non-display area is disposed between at least two of the plurality of pixel units.

7. The display device of claim 6, wherein the substrate comprises an opening disposed corresponding to the non-display area.

8. The display device of claim 1, wherein the first connection line comprises metal or metallic oxide.

* * * * *